(12) United States Patent
Aoki et al.

(10) Patent No.: US 10,211,120 B2
(45) Date of Patent: Feb. 19, 2019

(54) REWORK GRID ARRAY INTERPOSER WITH DIRECT POWER

(71) Applicant: Intel Corporation, Santa Clara, CA (US)

(72) Inventors: Russell S. Aoki, Tacoma, WA (US); Jonathan W. Thibado, Beaverton, OR (US); Jeffory L. Smalley, East Olympia, WA (US); David J. Llapitan, Tacoma, WA (US); Thomas A. Boyd, North Plains, OR (US); Harvey R. Kofstad, Vrnonia, OR (US); Dimitrios Ziakas, Hillsboro, OR (US); Hongfei Yan, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 14/998,123

(22) Filed: Dec. 23, 2015

(65) Prior Publication Data

US 2017/0186661 A1 Jun. 29, 2017

(51) Int. Cl.
*H01L 23/34* (2006.01)
*H01L 23/498* (2006.01)
(Continued)

(52) U.S. Cl.
CPC ...... *H01L 23/345* (2013.01); *H01L 23/49816* (2013.01); *H01L 23/49822* (2013.01);
(Continued)

(58) Field of Classification Search
CPC .. H05K 1/0213; H05K 1/0216; H05K 1/0218; H05K 1/0219; H05K 1/0224;
(Continued)

(56) References Cited

U.S. PATENT DOCUMENTS 7,474,540 B1 * 1/2009 Dang .................... H01L 23/147
 174/250
9,070,642 B2 * 6/2015 Standing ................. H01L 23/32
(Continued)

FOREIGN PATENT DOCUMENTS

JP 2015-150684 4/2015

OTHER PUBLICATIONS

International Search Report and Written Opinion from PCT/US2016/058879 dated Jan. 10, 2017, 7 pages.
(Continued)

*Primary Examiner* — Pete T Lee
(74) *Attorney, Agent, or Firm* — Schwabe, Williamson & Wyatt, P.C.

(57) ABSTRACT

A rework grid array interposer with direct power is described. The interposer has a foundation layer mountable between a motherboard and a package. A heater is embedded in the foundation layer to provide local heat to reflow solder to enable at least one of attachment or detachment of the package. A connector is mounted on the foundation layer and coupled to the heater and to the package to provide a connection path directly with the power supply and not via the motherboard. One type of interposer interfaces with a package having a solderable extension. Another interposer has a plurality of heater zones embedded in the foundation layer.

21 Claims, 14 Drawing Sheets

(51) Int. Cl.
*H05K 1/02* (2006.01)
*H05K 1/14* (2006.01)
*H05K 3/34* (2006.01)

(52) U.S. Cl.
CPC .......... *H05K 1/0212* (2013.01); *H05K 1/141* (2013.01); *H05K 1/144* (2013.01); *H05K 3/3436* (2013.01); *H05K 2201/10719* (2013.01); *H05K 2201/10734* (2013.01); *H05K 2203/176* (2013.01)

(58) Field of Classification Search
CPC .. H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/05; H05K 1/11; H05K 1/111; H05K 1/114; H05K 1/117; H05K 1/119; H05K 1/14; H05K 1/142; H05K 2201/09872; H05K 2201/10378; H05K 3/4602; H05K 3/4691; H05K 1/021; H05K 1/0212; H05K 1/0215; H05K 1/023; H05K 1/0231; H05K 1/0233; H05K 1/0234; H05K 1/0243; H05K 1/0295; H05K 1/141; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 3/10734; H05K 2203/176; H01L 23/345; H01L 23/49816; H01L 23/49822

See application file for complete search history.

(56)  References Cited

U.S. PATENT DOCUMENTS

| | | | |
|---|---|---|---|
| 2003/0000739 A1* | 1/2003 | Frutschy | H01L 23/49811 174/260 |
| 2004/0218372 A1* | 11/2004 | Hamasaki | G02B 6/43 361/767 |
| 2005/0174744 A1 | 8/2005 | Zheng | |
| 2008/0285244 A1* | 11/2008 | Knickerbocker | G01R 1/0425 361/760 |
| 2010/0330824 A1 | 12/2010 | Ulen et al. | |
| 2014/0082915 A1 | 3/2014 | Aoki et al. | |
| 2014/0162473 A1 | 6/2014 | Aoki et al. | |

OTHER PUBLICATIONS

International Preliminary Report on Patentability for PCT Patent Application No. PCT/US2016/058879 dated Jul. 5, 2018, 6 pgs.

* cited by examiner

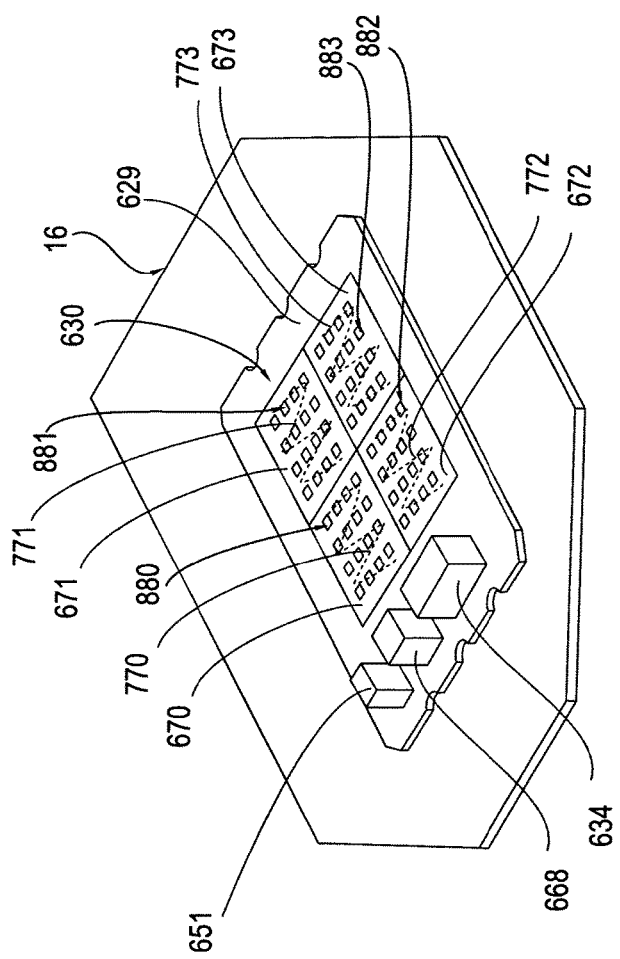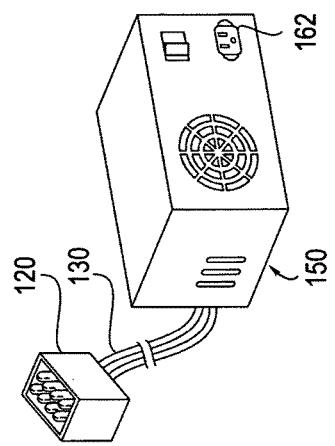
FIG. 11

REWORK GRID ARRAY INTERPOSER WITH DIRECT POWER

FIELD

The field relates to mounting packages on a printed circuit board. More particularly, the field pertains to power delivery to a rework grid array ("RGA") interposer that enables package configurability and provides power to a package.

BACKGROUND

To meet the need for miniaturization, electronic packaging technologies have provided solutions permitting increased densities. With a surface-mount technology ("SMT"), electronic components are mounted directly on the surface of a printed circuit board ("PCB"). One type of surface mount technology is a ball grid array ("BGA") package, which has pads on the bottom of the package with a solder ball initially on each pad. BGA packaging is quite small and typically used for handheld devices, such as smart phones.

Another high-density package is a land grid array ("LGA") package. An LGA package has a grid of contacts on the underside of the package. An LGA package is used with an LGA socket. One type of LGA socket has a grid of spring-like contacts, each with a landing pad for engagement with a respective metallic pad on the underside of a packaged electronic device. A typical use of an LGA socket is to hold a microprocessor of a desktop computer.

Given the spring-like nature of the grid of contacts in the LGA socket, a downward compressive force is needed to seat the package onto the LGA socket contacts and maintain the package in place. The force varies by the number of contacts the LGA socket has, and a typical range is 100 pounds to 300 pounds. One prior technique to provide the force has been to use an independent loading mechanism ("ILM"), which has a load plate, a load plate hinge, a load plate tongue, a hinge lever, and an active lever. Disadvantages of the ILM are its relatively large size, high cost, and high complexity.

Electronic devices and components are surface mounted on PCBs typically during the assembly and testing processes. In other words, configuration of the components is done at that time of the initial building of the motherboard. As a result, the motherboard contains multiple components that are not easily reconfigured.

Especially in the server segment, complexity is increasing, leading to the need for more devices and components. In particular, additional features and compatibilities are being added to the central processing unit ("CPU") package. Increasing performance is required from generation to generation. Changes are happening with respect to packaging, including the use of multichip packages. The CPU package power needs are increasing. The speed of the input/output ("I/O") signal for a CPU package is increasing dramatically. The device complexity of products is increasing due to more components being added to the CPU package.

The increase in product complexity has resulted in an increased need for better configurability. In the prior art, one way configurability was met was through the use of electrical/mechanical sockets. For example, a device in a socket could be later replaced by a different device. In addition, empty sockets could be added at assembly to be used later by additional devices. Typical disadvantages of these approaches, however, include high cost and complex implementation.

Another prior art way of reconfiguring components is through reworking. A typical prior art rework is a finishing operation or repair of components on a PCB, typically involving de-soldering or re-soldering done at a rework station with a heat station. A disadvantage of this approach is that a customer or end user might not have the specialized equipment needed.

The narrow traces and small contacts on typical SMT packages, sockets, and printed circuit boards are not suited for high power, high voltage, or high current.

BRIEF DESCRIPTION OF THE DRAWINGS

Embodiments are illustrated by way of example and not limitation in the figures of the accompanying drawings, in which like references indicate similar elements.

FIG. 11 illustrates an RGA power interposer attached to a motherboard and having multiple heater zones.

DETAILED DESCRIPTION

Embodiments of a rework grid array ("RGA") interposer are described in detail below. The RGA interposer receives power directly from a power supply unit.

Embodiments of the RGA interposer enhance configurability of electronic components, microprocessors, memories, integrated circuits, and microelectronics devices on a motherboard. Embodiments of the RGA interposer help to overcome the limitations on power delivery associated with motherboards and sockets.

Figure 1:
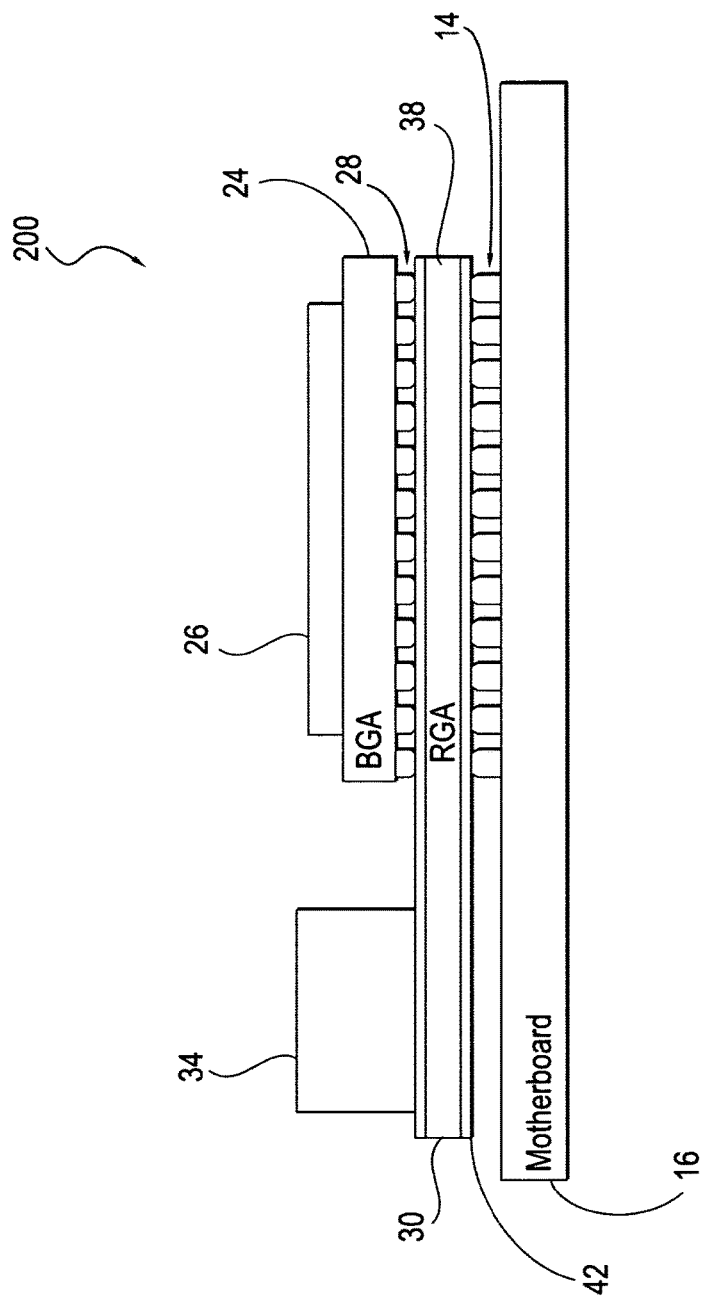
FIG. 1 is a side view of a rework grid array ("RGA") power interposer residing between a motherboard and a BGA package.
Figure 2:
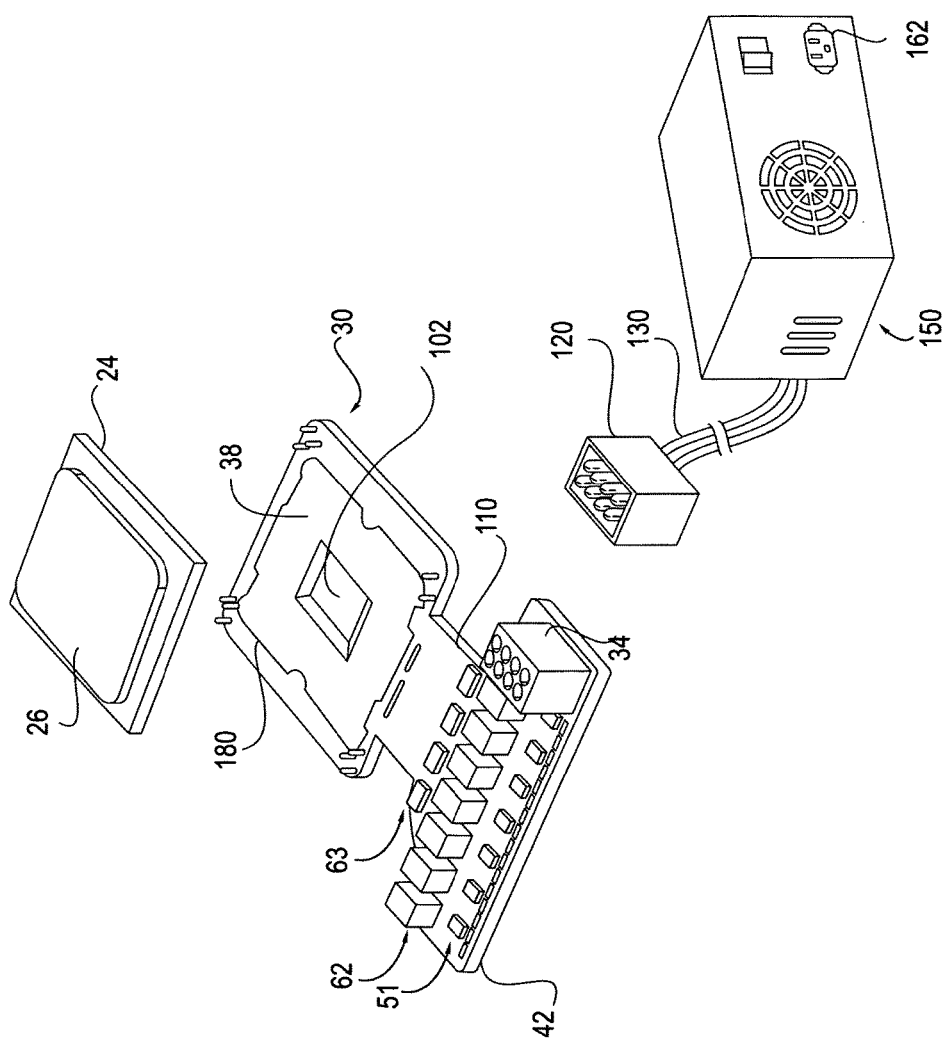
FIG. 2 is a perspective view of an RGA power interposer and a BGA package.
Figure 3:
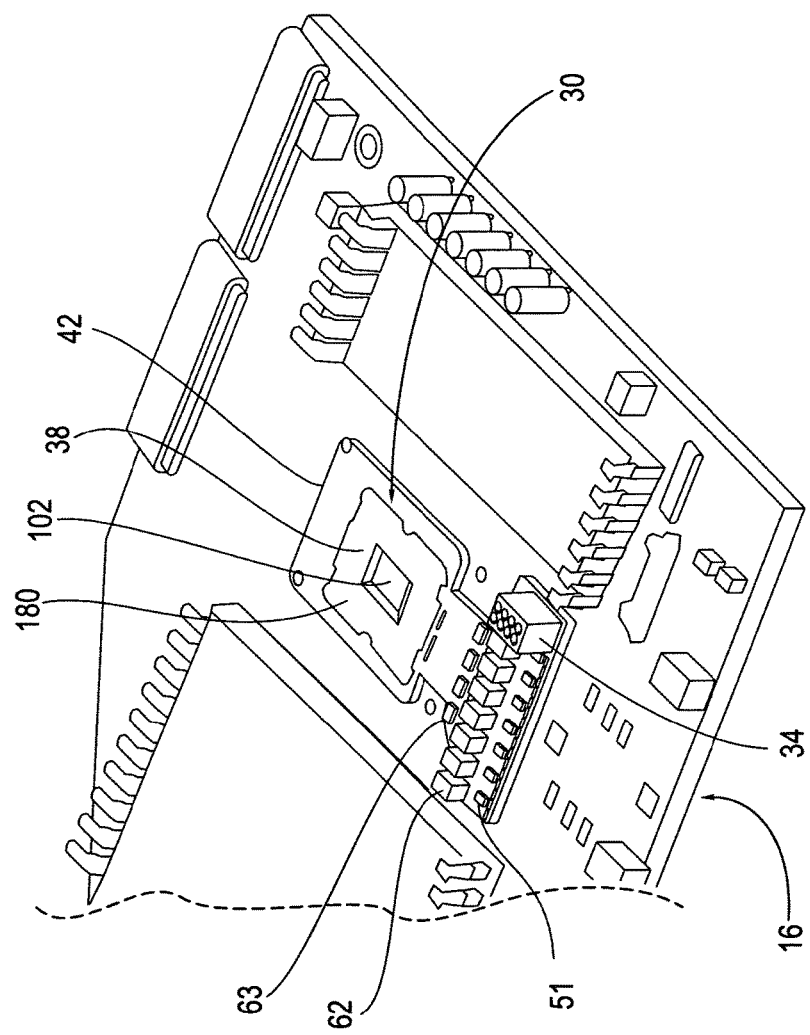
FIG. 3 is a perspective view of an RGA power interposer mounted on a motherboard.

FIGS. 1 to 3 show different views of RGA interposer 30. FIG. 1 is a side view of assembly 200 that includes motherboard 16, RGA interposer 30, BGA package 24, and electrical component 34. RGA interposer 30 resides between motherboard 16 and the BGA package 24. The BGA package 24 includes integrated circuit 26.

RGA interposer 30 has a foundation layer 42, which for one embodiment is a printed circuit board 42. For one embodiment, printed circuit board 42 is made of an FR-4 glass epoxy base with thin copper foil laminated on both sides (not shown). For certain embodiments, a multilayer printed circuit board 42 can be used, with pre-preg and copper foil (not shown) used to make additional layers. The printed circuit court 42 is patterned to form copper traces and pads (not shown) on the top and bottom of the printed circuit board 42. Holes (not shown) are also drilled in printed circuit board 42.

For one embodiment, motherboard 16 is also made of a multilayer printed circuit board having copper traces, metallic pads, and holes (not shown).

For certain embodiments, one or more heaters 38 are embedded in printed circuit board ("PCB") 42 of interposer 30. Each of the heaters 38 is a metallic resistive layer embedded in PCB 42. Each of the heaters provides heat upon the application of a voltage to ends of the metallic resistive layer. Heaters 38 reside in areas of PCB 42 that are areas intended for heating solder to either attach or detach electrical devices, integrated circuits, and components.

RGA interposer 30 is attached to motherboard 16 through the use of solder balls (or bumps) 14 that connect pads (not shown) on PCB 42 and motherboard 16. BGA package 24 is attached to interposer 30 through the use of solder balls (or bumps) 28 that connect pads (not shown) on package 24 and PCB board 42.

Connector 34 is attached to PCB 42 of interposer 30. For one embodiment, connector 34 is a female connector that receives a male connector 120 shown in FIG. 2 from a power cable 130 that is directly connected to a power supply unit 150 that supplies power to interposer 30. The power connection to interposer 30 via connector 34 bypasses the motherboard 16.

Having the power connection to interposer 30 bypassing motherboard 16 is advantageous because traces, pads, and sockets on a motherboard cannot handle higher voltages, higher current, and higher-power without increasing the copper content across the entire motherboard, which can drastically increase the cost of the motherboard. On the other hand, connector 34 and heaters 38 of interposer 30 are designed to handle higher power. In addition, the power cable or cables supplying power to connector 34 can also handle higher power.

When the relatively higher power is applied to the heaters 38 of RGA interposer 30, the heaters 38 can melt the solder balls 28, allowing the removal (detachment) of BGA package 24. A new or different BGA package (not shown) can then be attached in place of BGA package 24. The heat provided by heaters 38 would then melt the solder balls of the new package and allow attachment to PCB 42 of interposer 30.

In addition to supplying higher power to heaters 38, the higher power supplied through connector can supply higher power to integrated circuit 26. For one embodiment, integrated circuit 26 can be a microprocessor having higher power requirements.

FIG. 2 is a perspective view of RGA interposer 30 before BGA package 24 is attached.

FIG. 2 also shows power supply unit 150 for supplying power to RGA interposer 30 via a male connector 120 connected to power supply unit 150 via cables 130. Power supply unit 150 is coupled to alternating current ("AC") power with connector 162. For one embodiment, power supply unit 150 supplies power to a computer system (not shown) that includes motherboard 16 of FIG. 1 and interposer 30 of FIGS. 1 and 2. Power supply unit 150 converts a 110 volt alternating current voltage to a 5 volt direct current ("DC") voltage. For one embodiment, power supply unit 150 has a relatively high power rating—for example, 300 watts.

Male connector 120 plugs into female connector 34, supplying power from power supply unit 150 to RGA interposer 30. Power is routed from connector 34 through rows 51, 62, and 63 of power components and path 110 to heaters 38. For one embodiment, path 110 and heaters 38 are embedded in printed circuit board 42.

Power components 51, 62, and 63 are electrical components associated with the transmission of relatively higher power, including resistors, capacitors, inductors, and diodes for one embodiment. For one embodiment, power components 51, 62, and 63 comprise a voltage regulator ("VR") that supplies a regulated voltage to interposer 30.

Power delivery to interposer 30 is direct in that power does not pass through copper traces on motherboard 16 of FIG. 1. For one embodiment, power supply unit 150 of FIG. 2 is mounted on a computer system chassis (not shown) and not on motherboard 16. Power passes through cables 130, male connector 120, and female connector 34 shown in FIG. 2, which can handle higher power. In contrast, the traces, connectors, and sockets of motherboard 16 of FIG. 1 cannot handle higher power.

The higher power provided by power supply 150 and routed to interposer 30 via plug 120 and connector 34 can be used to supply device 26 in package 24 continuously with higher power that is not routed through motherboard 16. The regulated voltage supplied by components 51, 62, and 63 is especially useful for reliable operation of device 26. For various embodiments, device 26 can be a microprocessor, a memory, or other microelectronic device or component. Interposer 30 can supply higher power to such a higher power device 26 without the need to incur the expense of modifying the entire motherboard 16 to increase the copper content to handle higher power.

The higher power supplied to connecter 34 can also be used by heaters 38. The heaters 38 embedded under area 180 shown in FIG. 2 provide relatively high local heat sufficient to melt and reflow solder. The heat from heaters 38 permits the attachment, detachment, or reattachment of BGA package 24 containing integrated circuit 26. Area 180 is the area under the solder balls (or bumps) 28 shown in FIG. 1 of BGA package 24 shown in FIGS. 1 and 2.

Opening 102 of interposer 30 provides space for underside components, such as inductors, capacitors, and resistors, found in the central area of some integrated circuits, such as microprocessors.

The underside pattern of solder balls (or bumps) 28 of FIG. 1 forms a grid that area 180 of FIG. 2 underlies. Interposer 30 is referred to as a rework grid array interposer 30 given that heat from heaters 38 in the local area 180 reflows the solder balls of the grid array of package 24, permitting reworking.

FIG. 3 is a perspective view of RGA interposer 30 mounted on motherboard 16 of the computer chassis (not shown). The interposer 30 is mounted to motherboard 16 using the solder balls (or bumps) 14 shown in FIG. 1. For one embodiment, the solder balls 14 reside in a grid array (or pattern) on the underside of interposer 30 under area 180 of FIG. 3. The heat from heaters 38 embedded in printed circuit board 42 within area 180 provide local heat that permits the attachment, detachment, or reattachment of interposer 30 with respect to motherboard 16 given that the heat can melt and reflow solder balls 14 of FIG. 1.

FIG. 3 shows interposer 30 before package 24 of FIGS. 1 and 2 is mounted on interposer 30 and before male power connector 120 of FIG. 2 is plugged into connector 34 of FIGS. 1-3. FIG. 3 also shows power components 51, 62, and 63 as well as opening 180 in interposer 30.

Figure 4:
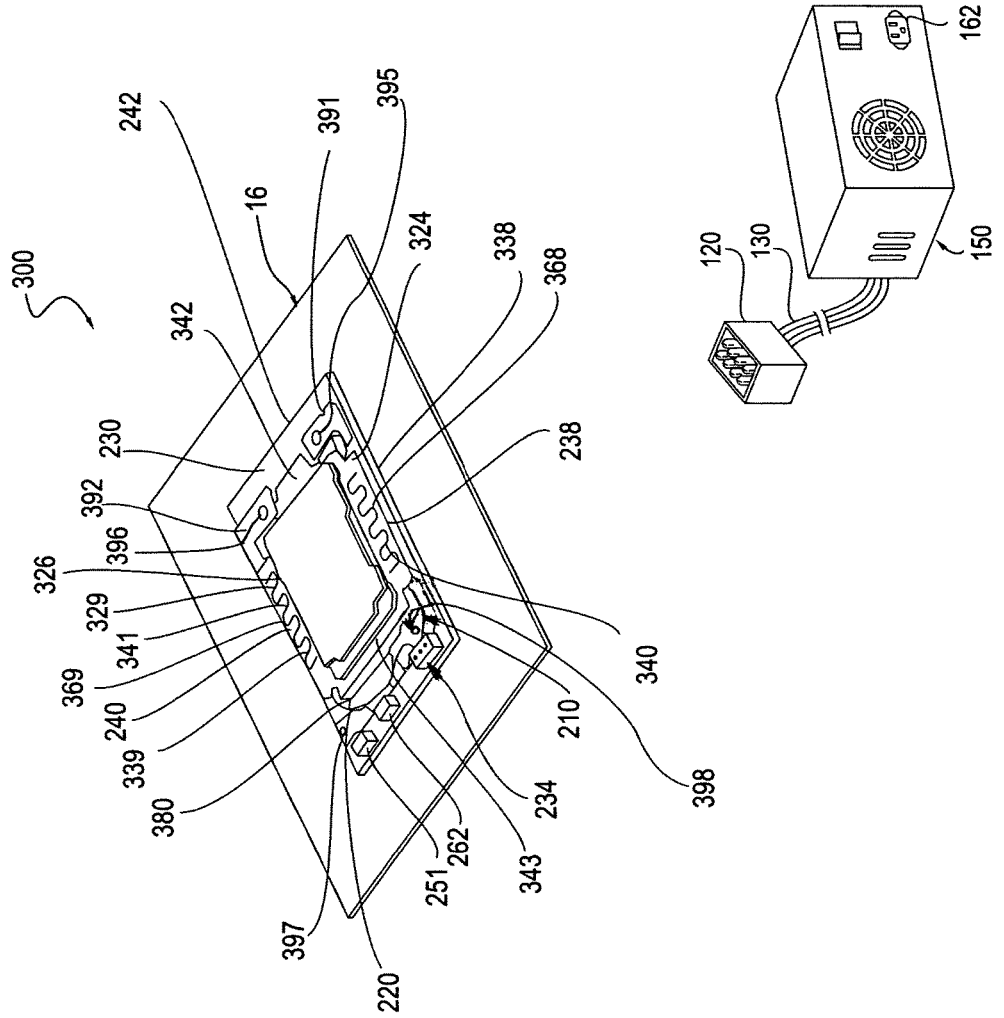
FIG. 4 illustrates (1) an LGA package with package wings and (2) an RGA power interposer that frames an LGA socket.
Figure 5:
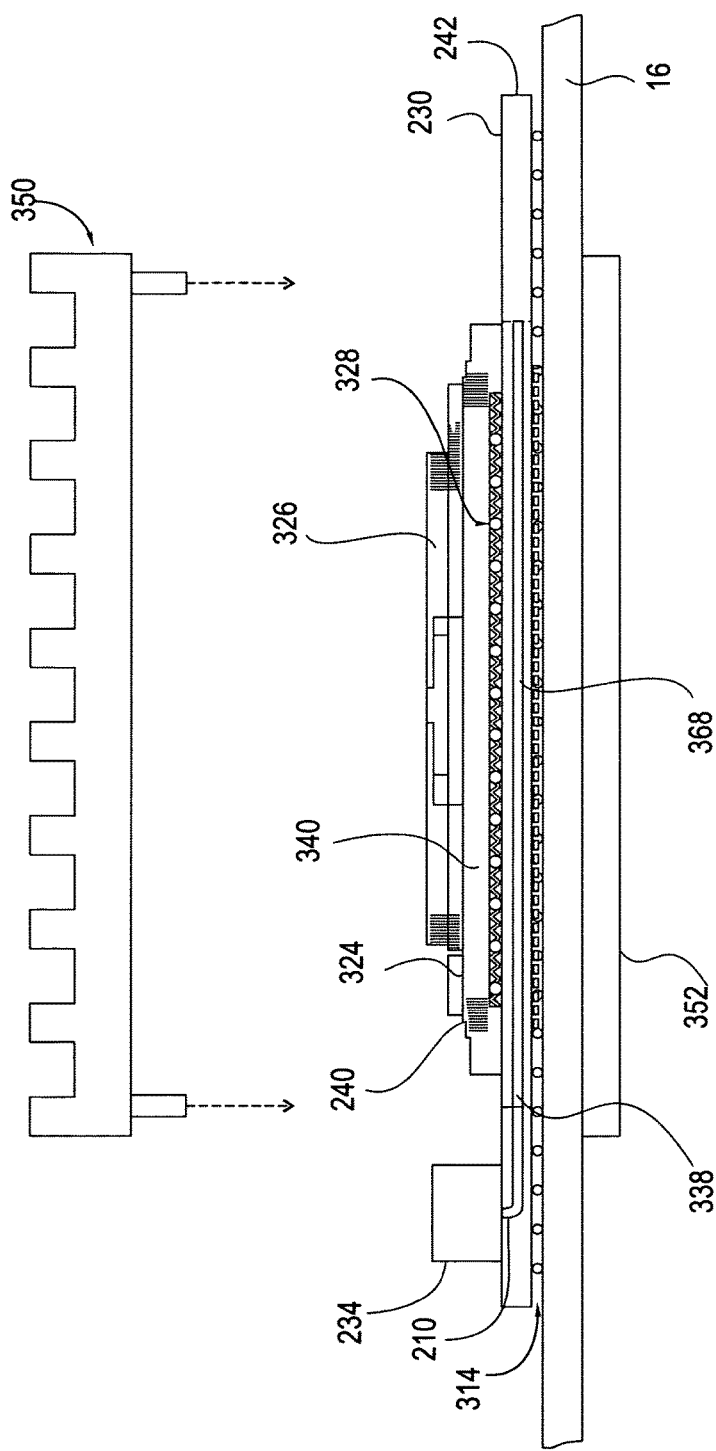
FIG. 5 is a side view of an RGA power interposer that frames an LGA socket.
Figure 6:
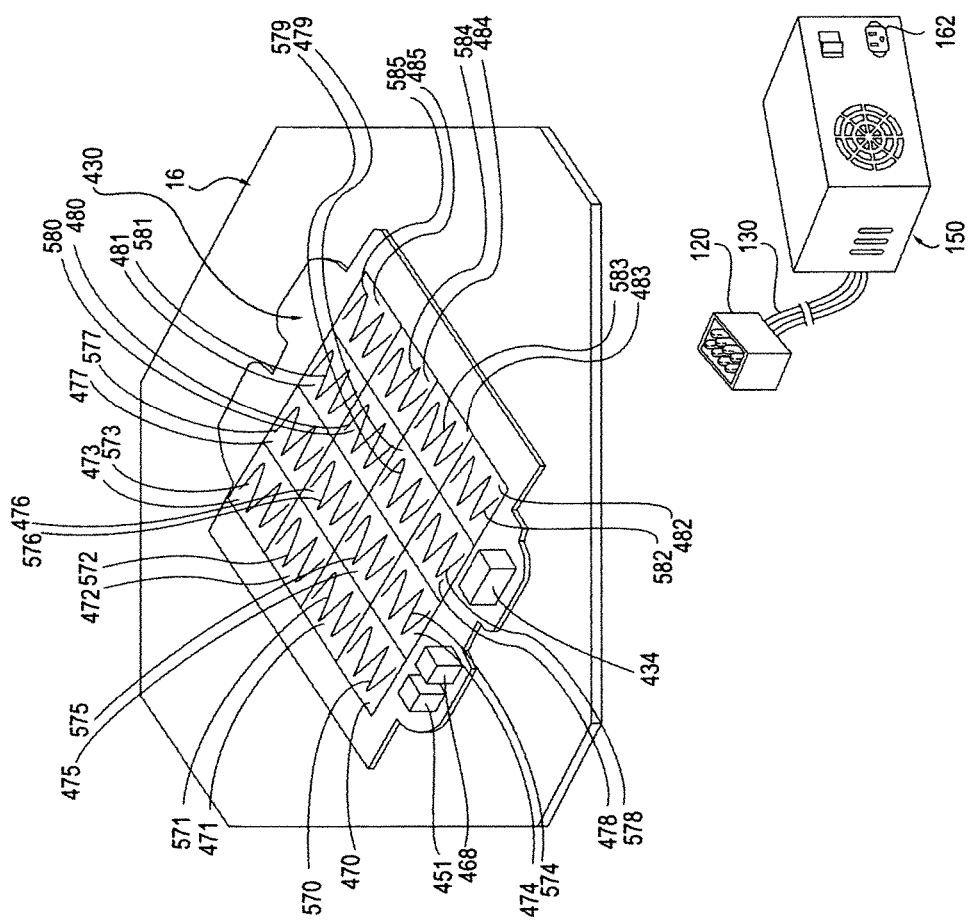
FIG. 6 illustrates an RGA power interposer that has multiple zones of heaters and is attached to a motherboard.

FIGS. 4 and 5 illustrate an embodiment that provides an advantageous way of mounting an integrated circuit 326 in a socket 380 and supplying higher power to integrated circuit 326. FIG. 4 is a perspective view of assembly 300 that for one embodiment includes a microprocessor 326 mounted in a legacy socket 380. Assembly 300 includes interposer 230 that is in the form of a frame around the perimeter of socket 380. In other words, interposer 230 has an opening in the middle in which resides socket 380. Interposer 230 is mounted on motherboard 16 through the use of a solder ball (or bump) grid array 314 on the underside of interposer 230. Interposer 230 uses a printed circuit board 242 as a foundation layer.

A female power connector 234 is mounted on interposer 230. The female power connector 234 can connect with male connector 120, which is connected to power supply unit 150 via wires 130. Power supply unit 150 is an AC to DC voltage supply that receives AC power at connector 162. Interposer 230 receives relatively high power from connector 234 without the power flowing through motherboard 16. As discussed above, there are limitations on how much power motherboard 16 can deliver unless an expensive copper-intensive motherboard is substituted. Interposer 230 includes electronic components 251 and 262 mounted on PCB 242 to regulate power.

For one embodiment, microprocessor 326 resides on package 240. Package 240 in turn is inserted in socket 280, which for one embodiment is a land grid array ("LGA") socket. For one embodiment, socket 280 is in LGA 1156 socket of Intel Corporation of Santa Clara, Calif. For one embodiment, package 240 is a flip chip LGA package with a grid of conductive metallic pads (not shown) on the underside of package 240.

For one embodiment, metallic power paths 210 and 220 extend from connector 234 to package 240. Connector 234 along with electronic components 251 and 262 supply higher regulated power to microprocessor 326, including during use of microprocessor 326, without a power path through motherboard 16. This is advantageous for a microprocessor with higher power requirements.

For other embodiments, another microelectronic device, such as a memory, can be used in place of microprocessor 326. Interposer 230 provides regulated higher power to such a device.

Package 240 has side wings (or extensions) 340 and 341 that extend beyond the edges of LGA socket 380. For one embodiment, side 342 of package 240 also extends beyond socket 240. For one embodiment, side 343 of package 240 does not extend beyond LGA socket 380.

For one embodiment, heaters 338 and 339 are embedded in the PCB 242 of interposer 230 at locations 368 and 369 that reside beneath respective wings 340 and 341 of package 240. Each of heaters 338 and 339 is a metallic resistive layer embedded in PCB 242. Metallic power path 210 also provides a path for power from connector 234 to heater 338. Metallic power path 220 also provides a path for power from connector 234 to heater 339. For one embodiment, metallic power paths 210 and 220 are embedded in PCB 242 of interposer 230.

The underside of extension (wing) 340 contains a grid of metallic pads (not shown) with respective solder bumps (or balls) 328. The solder balls (or bumps) 328 are connected to respective metallic pads (not shown) on the topside of location 368 of interposer 230. Similarly, the underside of extension (wing) 341 contains a grid of metallic pads (not shown) with respective soldier balls (or bumps) 329. Those solder balls (or bumps) 329 are connected to respective metallic pads (not shown) on the topside of location 369 of interposer 230.

When relatively high power is supplied to heater 338 at location 368 via connector 234 and metallic power path 210, heater 338 heats up to a relatively high temperature. This in turn melts solder balls (or bumps) 328 residing between the metallic pads on the underside of wing (extension) 340 and the metallic pads on the topside of location 368 of interposer 230. Similarly, when relatively high power is supplied to heater 339 at location 369 via connector 234 and metallic power path 220, heater 339 heats up to a relatively high temperature. This in turn melts solder balls (or bumps) 329 residing between the metallic pads on the underside of wing (extension) 341 and the metallic pads on the topside of location 369 of interposer 230.

The melting of solder balls (or bumps) 328 and 329 under respective wings (extensions) 340 and 341 of package 240 allows package 240 to be attached, detached, or reattached with respect to LGA socket 380.

When the solder balls (or bumps) 328 and 329 melt, this allows package 240 to be removed from LGA socket 380. The wings 340 and 341 are no longer attached via solder balls to regions 368 and 369 of interposer 230. Package 240 then can be lifted out of LGA socket 380.

On the other hand, and when solder balls (or bumps) 328 and 329 solidify after power is removed from heaters 338 and 339 (and heaters 338 and 339 cool down), package 240 is solidly attached in LGA socket 380. In other words, the wings (extensions) 340 and 341 are attached via the solder balls to interposer 230. Interposer 230 in turn is attached to motherboard 16. The attachment of the wings 340 and 341 to interposer 230 keeps package 240 engaged in LGA socket 380.

For one embodiment, a downward force or load is applied to package 240 after package 240 is placed in LGA socket 380 and while solder balls (or bumps) 338 and 339 are solidifying. This force or load helps to keep package 240 in place in the LGA socket 380, given that the contacts (not shown) in LGA socket 380 have a spring force. The force or load is removed after the solder balls (or bumps) 338 and 339 solidify.

Using wings 340 and 341 to attach package 240 to interposer 230 via solder balls is advantageous given that a separate independent load mechanism ("ILM") is not required to keep package 240 in socket 380. This helps to reduce cost and complexity, and also results in a smaller overall structure.

Once package 240 is attached to socket 380 and held in place by the solid attachment of wings 340 and 341 to interposer 230, a heat sink 350 can be placed on top of microprocessor 326. The heat sink 350 can be held in place by attachment to a booster plate 352 under motherboard 16 via holes 395 to 398.

Heating solder balls (or bumps) 328 and 329 in turn allows them to melt, allowing removal of package 240 from LGA socket 380. Once the solid attachment force provided by solder balls (or bumps) 328 and 329 is removed (because of the melting of those solder balls), the spring force provided by the contacts (not shown) of LGA socket 380 pushes package 240 upward out of the socket 380. Package 240 can then removed from LGA socket 380 once heat sink 350 is removed.

For another embodiment, heaters 338 and 339 reside in respective wings (extensions) 340 and 341 of package 240 rather than in locations 368 and 369 of interposer 230. For that embodiment, metallic power paths 210 and 220 extend from connector 234 to package 240 and connect with respective heaters 338 and 339 in respective wings 340 and 341.

FIGS. 6 to 9 show other embodiments of an interposer. Rework grid array power interposer 430 is surface mounted to motherboard 16 using surface mount technology, such as a grid of solder balls (not shown) coupling metallic pads (not shown) on the underside of interposer 430 with metallic pads (not shown) on motherboard 16.

For one embodiment, interposer contains 16 heaters 570 to 585 embedded in interposer 430. Each of the heaters 570 to 585 forms a heater zone. The result is that interposer 430 has 16 heater zones 470 to 485.

Interposer 430 receives DC power directly from power supply 150 via (1) connector 434 on interposer 430, (2) connector 120, and (3) power cables 130. Power supply 150 receives AC power via connector 162. This direct power routes means that interposer 430 is not subject to the lower power limits associated with power delivery to traces on a motherboard, such as motherboard 16, or to socket connections.

Interposer 430 contains power component 451 to help manage the power supplied to interposer 430.

For one embodiment, power is sent from connector 434 to switch 468. Switch 468 is in turn connected to heaters 575 to 585 of respective heater zones 470 to 485. Switch 468 allows one to select which heater or heaters of heaters 570 to 585 receives the high power from connector 434. Thus, one, some, none, or all heaters 570 to 585 can be powered at the same time. Thus, interposer 430 allows heaters 570 to 585 and heater zones 470 to 485 to be independently controllable.

For one embodiment, switch 468 can be controlled by software.

For an alternative embodiment, switch 468 is eliminated. For that embodiment, terminals of connector 434 are connected to respective heaters 570 to 585. Particular heaters of heaters 570 to 585 are provided with power by providing power to respective terminals of connector 434.

Having multiple heater zones 470 to 485 permits selective attachment, detachment, or reattachment of components with respect to rework grid array interposer 430. Thus, after an initial building of an electronic system using motherboard 16, electronic components can be removed and added. This enhances configurability.

Figure 7:
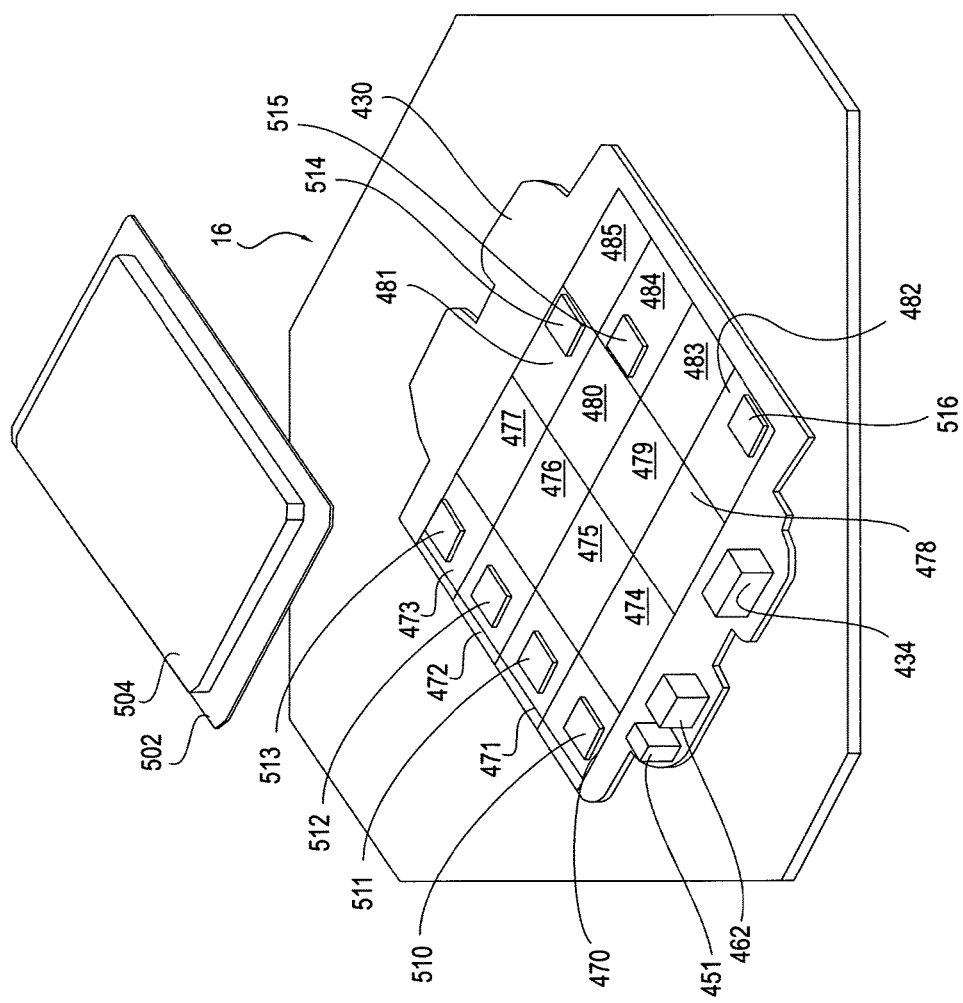
FIG. 7 illustrates a microprocessor to be added to an RGA power interposer having microelectronic devices.

As shown in FIG. 7, for one embodiment, microelectronic devices 510 to 516 are initially mounted to RGA interposer 430 using surface mount technology, such as respective ball grid arrays. The microelectronic devices 510 to 516 can be, for example, memories or other integrated circuits. As shown in FIG. 7, the microelectronic devices 510 to 513 are mounted in respective heater zones 470 to 473. Microelectronic device 514 is mounted in heater zone 481. Microelectronic device 515 is mounted in heater zone 484. Microelectronic device 516 is mounted in heater zone 482.

For one embodiment, after the initial configuration of interposer 430, a user wishes to add a package 502 containing a microprocessor 504, as shown in FIG. 7. For one embodiment, power is applied to heater zones 474 to 481 and 484 by using switch 468. Microelectronic devices 514 and 515 are then removed once their solder ball attachments (not shown) melt due to the applied heat from heater zones 481 and 484. Package 502 is then be mounted over heater zones 474 to 481. The heat from heater zones 474 to 481 allows the solder balls of the ball grid array (not shown) under package 502 to melt. Once heat is removed from heater zones 474 to 481, then the solder balls of the ball grid array (not shown) under package 502 solidify. The result is that package 502 is attached to interposer 430.

Figure 8:
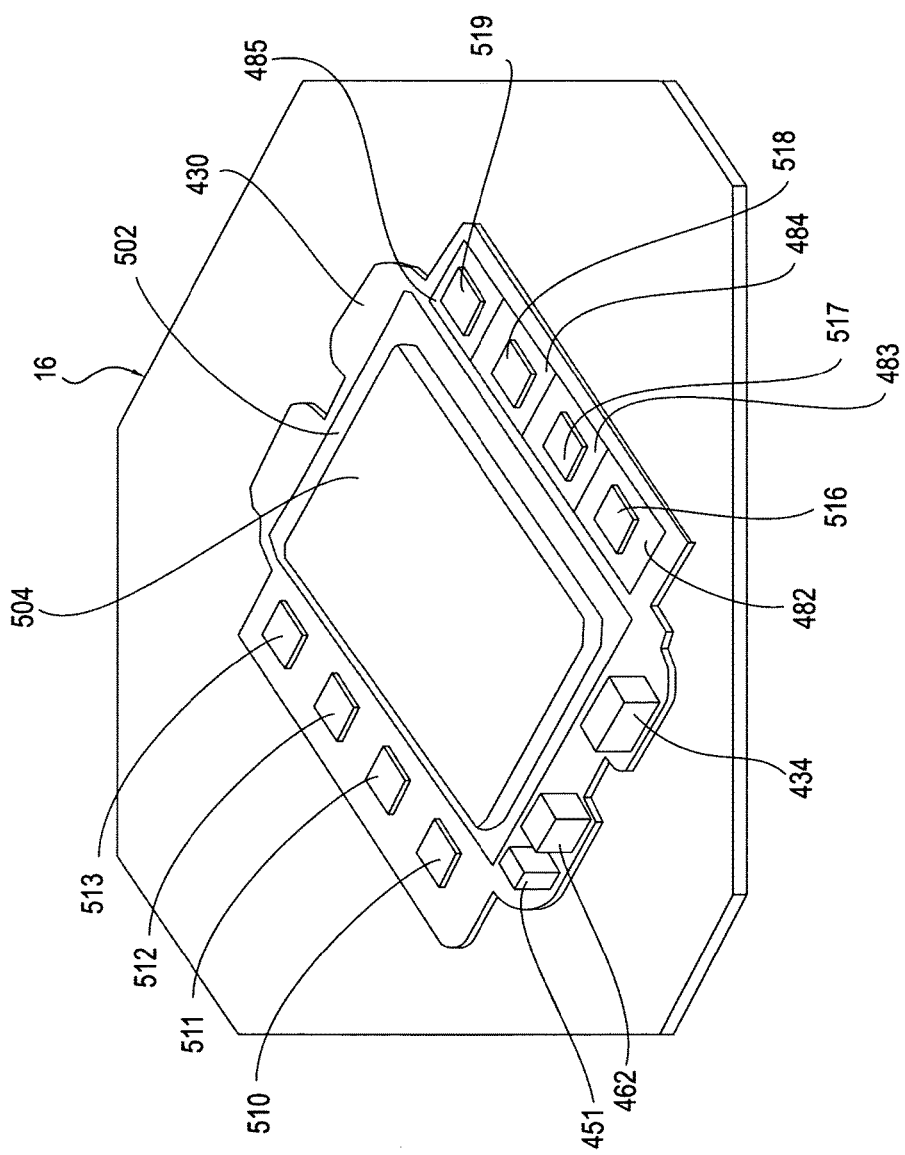
FIG. 8 illustrates an RGA power interposer with the microprocessor and other microelectronic devices attached.

FIG. 8 shows the end result of package 502 being attached to interposer 430. FIG. 8 shows that additional microelectronic devices 517 to 519 can also be mounted on interposer 430 through the use of heater zones 483, 484, and 485.

Figure 9:
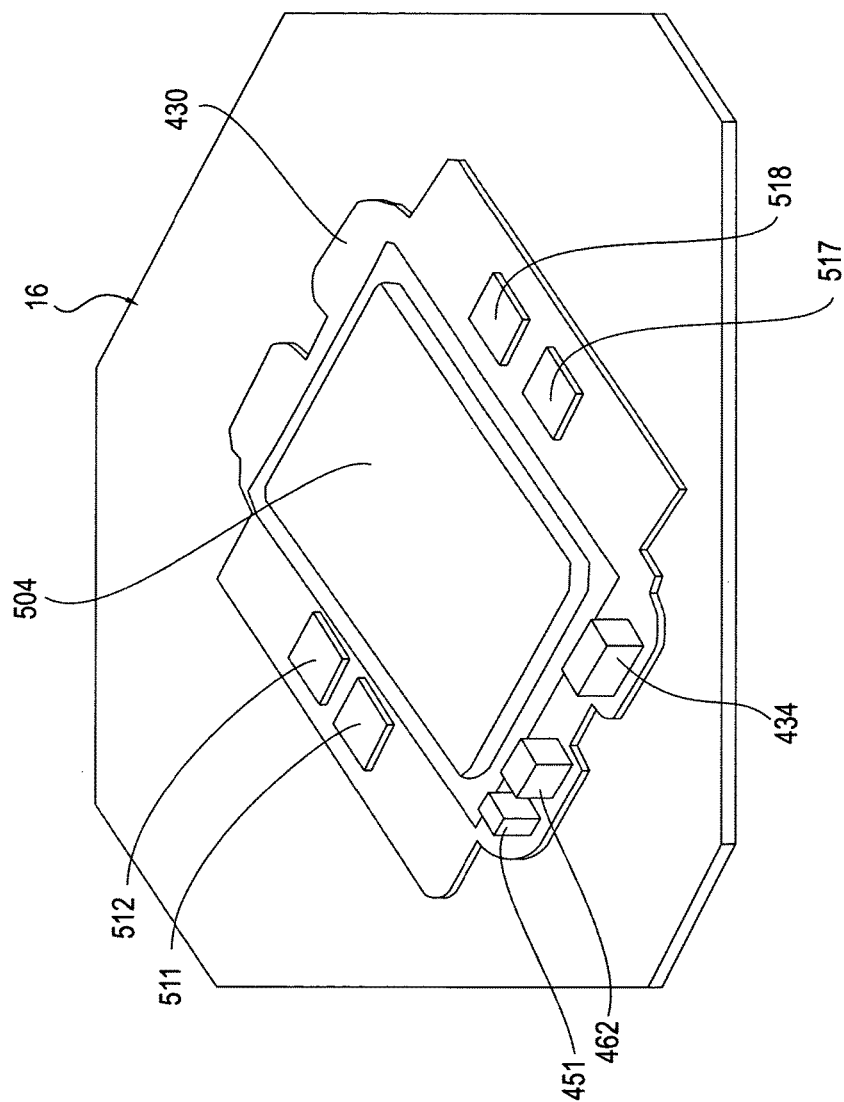
FIG. 9 illustrates an RGA power interposer with an alternate configuration of a microprocessor and microelectronics devices.

Other configurations of microelectronic devices are possible through the use of heater zones 470 to 485. FIG. 9 shows an example of a configuration that includes microelectronic devices 511, 512, 517, and 518 along with package 502 containing microprocessor 504. For one example, microelectronic devices 511, 512, 517, and 518 are each a memory.

Interposer 430 can be used to supply higher power directly and continuously to package 502 and microprocessor 504 bypassing motherboard 16. This is advantageous if microprocessor 504 has higher power requirements. Electrical component ensures regulation of the voltage to improve reliability. The higher power supplied by interposer 430 can also supply other microelectronic devices on interposer 430, such as devices 511, 512, 517, and 518 shown in FIG. 9. Those other devices can be various types of devices, including memory and other integrated circuits and components Rework grid array interposer 430 is advantageous given that components can be added or removed, allowing changes in the field or at the factory. For example, the memory components associated with a microprocessor can be reconfigured. As another example, a more powerful microprocessor can be substituted for an earlier generation microprocessor.

For other embodiments, interposer 430 can have fewer than 16 heater zones 470 to 485 or more than 16 heater zones. For other embodiments, switch 468 can be locally controlled at interposer 430 or remotely controlled.

FIGS. 10 to 13 show yet other embodiments of an interposer.

Figure 10:
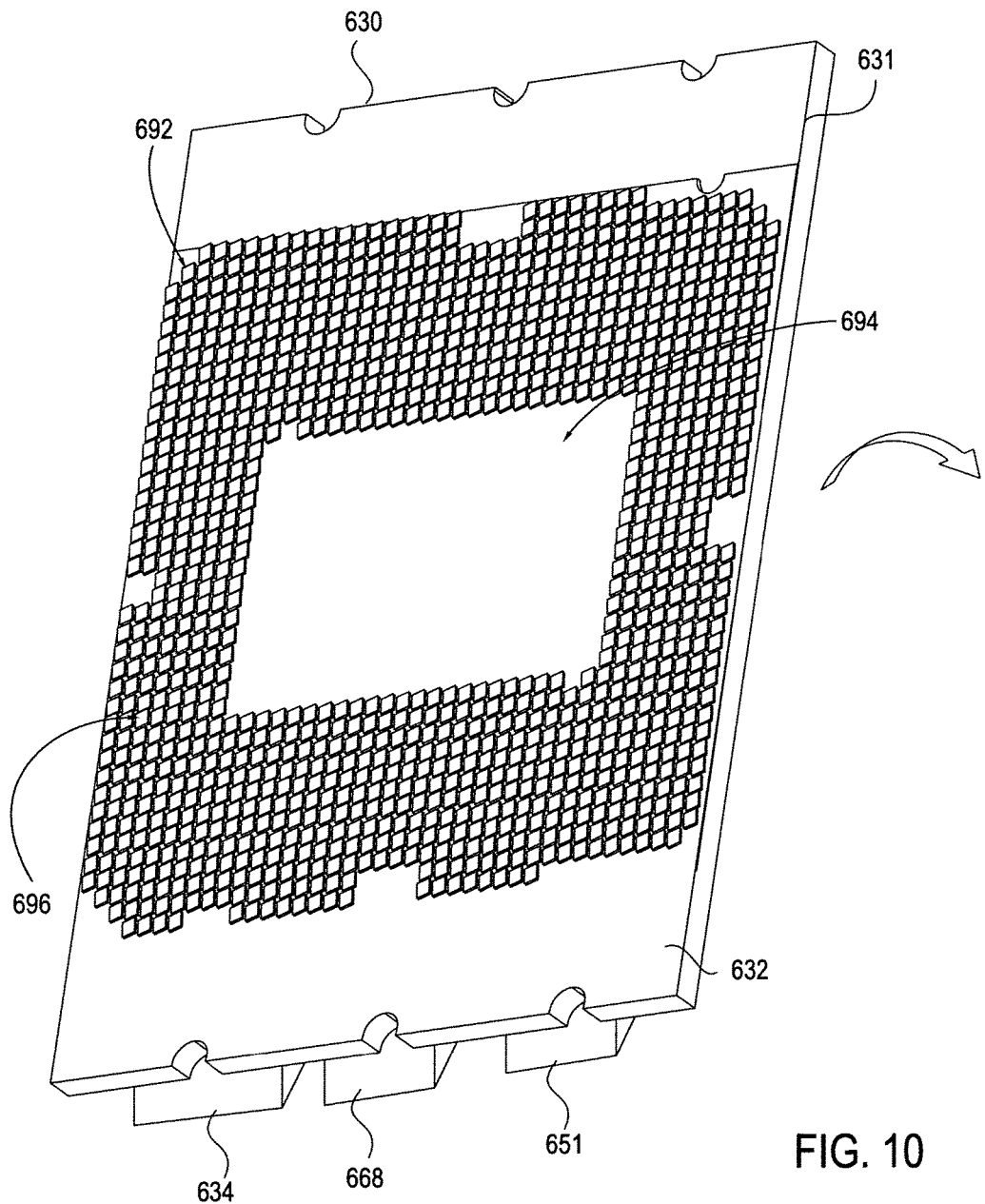
FIG. 10 illustrates a bottom view of an RGA power interposer.

FIG. 10 shows the underside 692 of rework grid array interposer 630. Underside 692 contains a grid 696 of conductive metallic pads.

Interposer 630 also has wings (i.e., extensions) 631 and 632 that do not contain pins or metallic pads.

For one embodiment, interposer 630 of FIG. 10 is configured to be pin-compatible with a socket. For one embodiment, interposer 630 includes central area 694 without metallic pads.

For other embodiments, the underside 692 of interposer 630 has a different grid 696 of metallic pads and is not pin-compatible with a socket. For other embodiments, interposer 630 includes metallic pads in central area 694.

For one embodiment, interposer 630 is flipped over and mounted on motherboard 16, as shown in FIG. 11. Solder balls residing between the metallic pads of grid 696 of interposer 630 and metallic pads (not shown) on motherboard 16 are reflowed by applying heat and then cooled, attaching interposer 630 electrically and mechanically to motherboard 16.

Interposer 630 has four zones 670 to 673 containing respective embedded heaters 770 to 773. Each of the heaters 770 to 773 is independently controllable by heater switch 668 mounted on topside 629 of interposer 630.

Grids 880 to 883 of metallic pads are on the topside of respective zones 670 to 673. Each of the grids 880 to 883 is pin compatible with a microelectronic device to be mounted in the respective zone. For one embodiment, the microelectronic device is an LGA package. For another embodiment, the microelectronic device is a BGA package.

Heaters 770 to 773 receive power via switch 668, which in turn is connected to connector 634 mounted on interposer 630. Power supply 150 provides DC power to interposer 630 when connector 120 of power supply 150 is plugged into connector 630. Connector 120 is connected to power supply 150 by wires 130. Power supply 150 receives AC power from connector 162. Power component 651 mounted topside 629 of interposer 630 helps manage the power supplied to interposer 630, supplying regulated voltage.

Switch 668 permits one to select which heater or heater of heaters 770 to 773 receives the high power from connector 634. Thus one, some, none, or all of heaters 770 to 773 can be powered at the same time. Thus, RGA interposer 630 allows heaters 770 to 773 and heater zones 670 to 673 to be independently controllable.

For one embodiment, switch 668 is software controlled.

For an alternative embodiment, there is no switch 668 and power is selectively applied to heaters 770 to 773 by selective application of power to respective terminal of connector 634.

Having multiple heater zones 670 to 673 permits selective attachment, detachment, or reattachment of components with respect to RGA interposer 630. Thus, after an initial building of an electronic system using motherboard 16, electronic components can be removed and added. This enhances configurability.

For one embodiment, heaters 770 to 773 also can be used to reflow solder under interposer 630 to allow interposer 630 to be attached or detached to motherboard 16.

Figure 12:
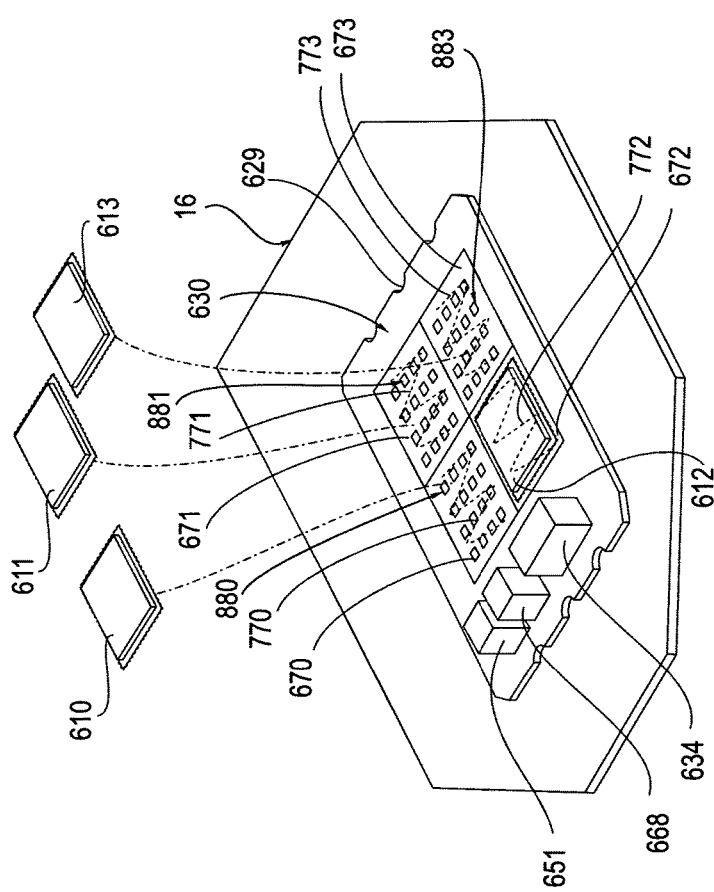
FIG. 12 illustrates an attachment of one of four BGA packages to an RGA power interposer with multiple heater zones.

As shown in FIG. 12, for one embodiment, microelectronic device 612 is initially mounted to RGA interposer in heater zone 672 using surface mount technology, such as a ball grid array (not shown). For another embodiment, microelectronic device 16 is in an LGA package that is placed directly on interposer 630 and attached using a direct solder attach between the LGA package and the interposer 630. For one embodiment, microelectronic device 612 can be a microprocessor. For another embodiment, microelectronic device 612 can be a memory. For other embodiments, microelectronic device 612 can be another type of integrated circuit or electrical component.

Figure 13:
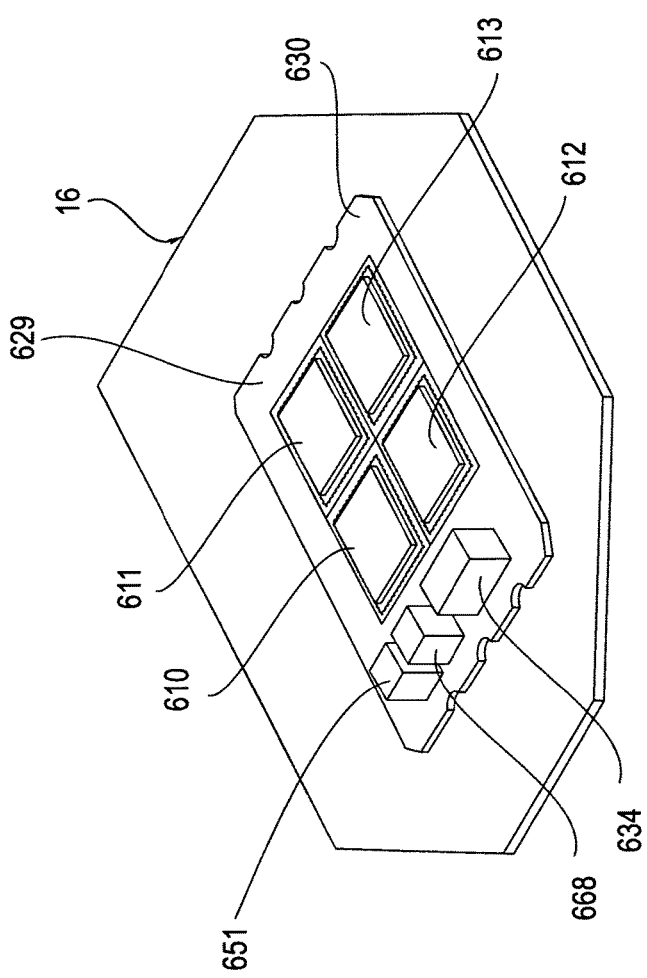
FIG. 13 shows four BGA packages mounted on an RGA power interposer with multiple heater zones.

For one embodiment, after the initial configuration of interposer 430, a user wishes to add microelectronic devices 610, 611, and 612, as shown in FIG. 12. For one embodiment, microelectronic devices are placed in heater zones 670, 671, and 673, as shown in FIGS. 12 and 13. Power is then applied to heaters 770, 771, and 773 of respective heater zones 670, 671, and 673 by using switch 668. The heat from heaters 770, 771, and 773 in respective heater zones 670, 671, and 673 reflows the BGA solder balls (bumps) (not shown) on the undersides of microelectronic devices 610, 611, and 613. After the solder balls melt, the power is removed from heater zones 670, 671, and 673 by turning off switch 668 or turning off power supply 150. The solder balls then solidify after cooling, thereby attaching microelectronic devices 610, 611, and 613 in place on the topside 629 of interposer 630. The solidified solder balls (not shown) would connect the metallic pads (not shown) on the respective undersides of microelectronic devices 610, 611, and 613 with metallic pads 880, 881, and 883 on topside 629 of interposer 630 in respective zones 670, 671, an 673.

Microelectronic devices 610, 611, and 613 can be various devices, including memories, microprocessors, integrated circuits, and electrical components.

For other embodiments, interposer 630 can have more or fewer zones than zones 670 to 673.

For other embodiments, the heaters 770 to 773 can be powered in any combination, and various microelectronic devices attached, detached, or reattached.

In addition to enhancing configurability, interposer 630 permits increased processor density given that microelectronic devices 610 to 613 can be microprocessors.

Interposer 630 can be used to supply regulated higher power directly and continuously to the microelectronic devices 610, 611, 612, and 613, bypassing motherboard 16. This is advantageous for microelectronic devices with high power requirements, such as microprocessors.

Various fabrication techniques can be used in conjunction with the RGA interposers described above in connection with FIGS. 1 to 13.

For one or more embodiments, the methods described herein may be omitted or performed in a sequence that is different from what is illustrated or described herein.

The terms "over," "to," "between," and "on" as used in the foregoing specification refer to a relative position of one layer with respect to other layers. One layer "over" or "on" another layer or bonded "to" or in "contact" with another layer may be directly in contact with the other layer or may have one or more intervening layers.

The description provided above in connection with one or more embodiments of a semiconductor package may also be used for other types of integrated circuits ("IC") packages and mixed logic-memory package stacks.

Figure 14:
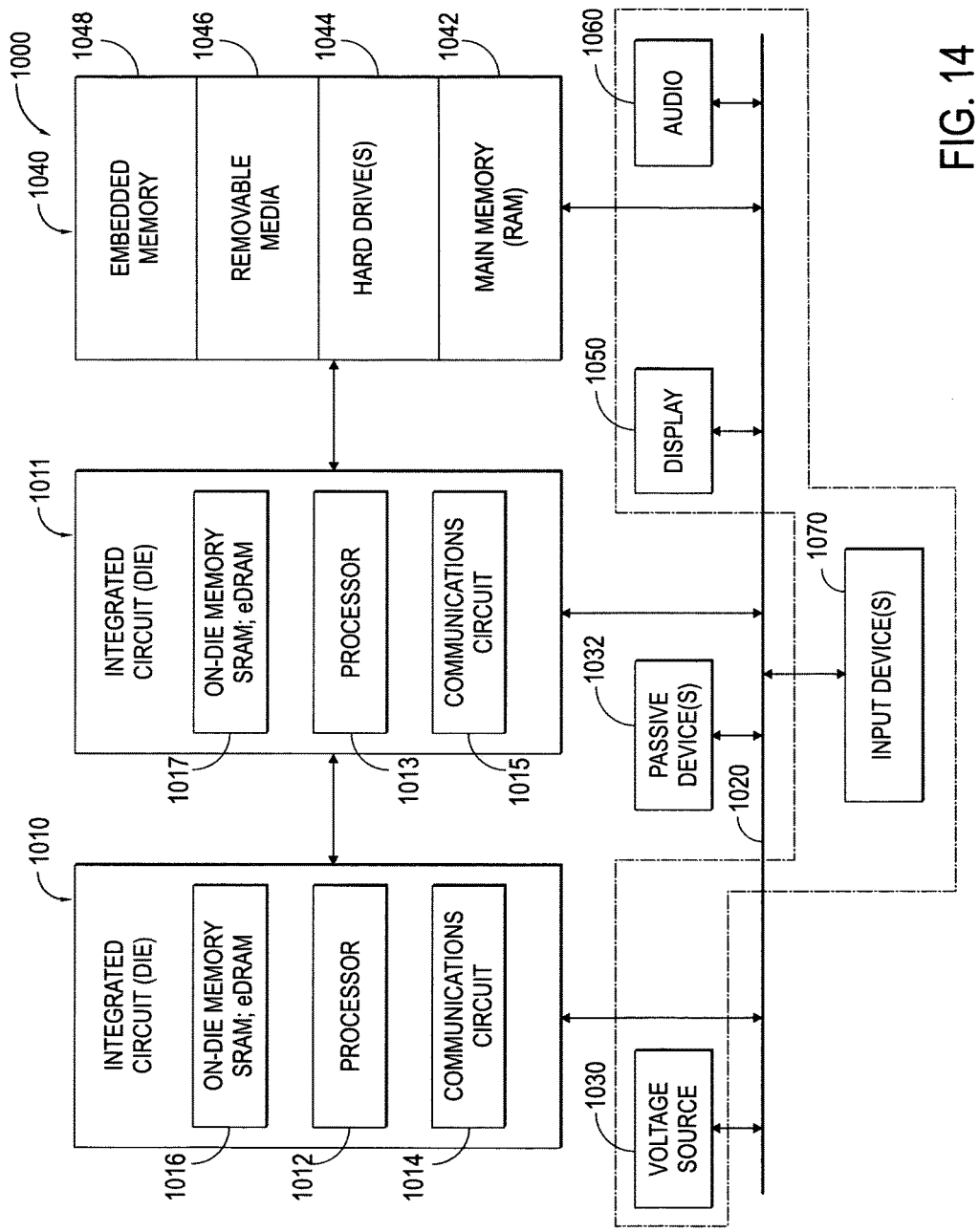
FIG. 14 illustrates a computer system that includes integrated circuits and components mounted on an RGA power interposer.

The computer system 1000 (also referred to as the electronic system 1000) as depicted in FIG. 14 can employ one or more rework grid array interposers with direct power, according to any of the several disclosed embodiments and their equivalents as set forth in this disclosure. The computer system 1000 may be a mobile device such as a netbook computer or a wireless smart phone. The computer system 1000 may be a desktop computer. The computer system 1000 may be a hand-held reader. The computer system 1000 may be a server system. The computer system 1000 may be a supercomputer or high-performance computing system.

For an embodiment, the electronic system 1000 is a computer system that includes a system bus 1020 to electrically couple the various components of the electronic system 1000. The system bus 1020 is a single bus or any combination of buses according to various embodiments. The electronic system 1000 includes a voltage source 1030 that provides power to the integrated circuit 1010. For some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. For an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 is mounted on a rework grid power interposer such as interposers 30, 230, and 430 of FIGS. 1 to 13. In an embodiment, static random-access memory ("SRAM") embodiments are found in memory caches of the processor. Other types of circuits that can be included in the integrated circuit 1010 are a custom circuit or an application-specific integrated circuit ("ASIC"), such as a communications circuit 1014 for use in wireless devices such as cellular telephones, smart phones, pagers, portable computers, two-way radios, and similar electronic systems, or a communications circuit for servers. For an embodiment, the integrated circuit 1010 includes on-die memory 1016 such as static random-access memory ("SRAM"). For an embodiment, the integrated circuit 1010 includes embedded on-die memory 1016 such as embedded dynamic random-access memory ("eDRAM").

For an embodiment, the integrated circuit 1010 is complemented with a subsequent integrated circuit 1011. Useful embodiments include a dual processor 1013 and a dual communication circuit 1015 and duel on-die memory 1017 such as SRAM. In an embodiment, the dual integrated circuit 1010 includes embedded on-die memory 1017 such as eDRAM.

For an embodiment, the electronic system 1000 also includes an external memory 1040 that in turn may include one or more memory elements suitable to the particular application, such as a main memory 1042 in the form of random-access memory ("RAM"), one or more hard drives 1044, and/or one or more drives that handle removable media 1046, such as diskettes, compact discs ("CDs"), digital variable disks ("DVDs"), flash memory drives, and other removable media known in the art. The external memory 1040 may also be embedded memory 1048 such as the first die in a die stack, according to an embodiment.

For an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, and input device 1070 is a camera. For an embodiment, an input device 1070 is a digital sound recorder. For an embodiment, an input device 1070 is a camera and a digital sound recorder.

As shown herein, the integrated circuit 1010 can be implemented in a number of different embodiments, including a package substrate attached to an RGA power interposer, according to any of the several disclosed embodiments and their equivalents, an electronic system, a computer system, one or more methods of fabricating an integrated circuit, and one or more methods of fabricating an electronic assembly that includes a package substrate attached to an RGA power interposer, according to any of the several disclosed embodiments as set forth here in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates attached to an RGA power interposer embodiments and their equivalents. A foundation substrate may be included, as represented by the dashed line of FIG. 14. Passive devices 1032 may also be included, as is also depicted in FIG. 14.

The following are examples of embodiments.

For one embodiment, an interposer includes a foundation layer mountable between a motherboard and a package. A heater is embedded in the foundation layer to provide local heat to reflow solder to enable attachment or detachment of the package. A connector is mounted on the foundation layer and coupled to the heater and to the package. The connector provides a connection path directly with the power supply and not via the motherboard.

For another embodiment, the interposer further includes a power component mounted on the foundation layer and coupled to the connector, to the heater, and to the package, wherein the power component provides voltage regulation.

For another embodiment, the foundation layer of the interposer is a printed circuit board.

For another embodiment, the package is a ball grid array ("BGA") package.

For another embodiment, an interposer includes a foundation layer, which is mounted on a motherboard. A heater provides local heat to reflow solder to enable attachment or detachment of the package with respect to a socket. The package includes a solderable extension beyond the socket. For one embodiment, the heater is embedded in the foundation layer and the solderable extension resides above the heater. For another embodiment the heater is embedded in the solderable extension of the package. A connector is mounted on the foundation layer and is coupled to the heater and to the package. The connector provides a connection path directly with a power supply not via the motherboard.

For one embodiment, the foundation layer of the interposer frames a perimeter of a socket mounted on a motherboard.

For another embodiment, the foundation layer of the interposer resides between the socket and the motherboard.

For another embodiment, the interposer further includes a power component mounted on the foundation layer, wherein the power component provides voltage regulation.

For one embodiment, the foundation layer of the interposer is a printed circuit board.

For one embodiment, the socket is a land grid array (LGA) socket and the package comprises an LGA package.

For a further embodiment, an interposer includes a foundation layer mountable between a motherboard and a plurality of packages. A plurality of heater zones are embedded in the foundation layer to provide local heat to reflow solder to enable attachment or detachment of the plurality of packages respectively. A connector is mounted on the foundation layer and is coupled to the plurality of heater zones and to the plurality of packages. That connector provides connection paths directly with the power supply and not via the motherboard.

For one embodiment, the interposer further includes a power component mounted on the foundation layer and coupled to the connector, to the heater zones, and to the plurality of packages.

For one embodiment, the foundation layer of the interposer is a printed circuit board.

For one embodiment, each of the plurality of packages is a ball grid array (BGA) package.

For another embodiment, an interposer includes a foundation layer with a plurality of zones of metallic pads for receiving a plurality of packages, wherein the foundation layer is mountable on a motherboard. A plurality of heater zones are embedded in the foundation layer to provide local heat to reflow solder to enable attachment or detachment of the plurality of packages respectively with respect to a topside of the foundation layer. A connector is mounted on the foundation layer and is coupled to the plurality of heaters zones and to the plurality of packages. The connector provides connection paths directly with a power supply and not via the motherboard.

For one embodiment, the interposer further includes a power component mounted on the foundation layer and coupled to the connector, to the plurality of heaters zones, and to the plurality of packages.

For one embodiment, the foundation layer of the interposer is a printed circuit board.

For one embodiment, each of the plurality of packages is a ball grid array (BGA) package.

For one embodiment, each of the plurality of packages is a land grid array (LGA).

In the foregoing specification, the description has been with respect to specific exemplary embodiments. It will, however, be evident that various modifications and changes may be made thereto without departing from the broader spirit and scope. The specification and drawings are, accordingly, to be regarded in an illustrative rather than a restrictive sense.

What is claimed is:

1. An interposer comprising:
a foundation layer mountable between a motherboard and a package, the package comprising a die mounted to a package substrate;
a heater embedded in the foundation layer to provide local heat to reflow solder to enable at least one of attachment or detachment of the package; and
a connector mounted on the foundation layer and coupled to the heater and to the package to provide a connection path directly with a power supply, the connection path bypassing the motherboard to supply power to the die and the heater.

2. The interposer of claim 1, further comprising a power component mounted on the foundation layer and coupled to the connector, to the heater, and to the package, wherein the power component provides voltage regulation.

3. The interposer of claim 1, wherein the foundation layer comprises a printed circuit board.

4. The interposer of claim 1, wherein the package comprises a ball grid array (BGA) package.

5. An interposer comprising:
a foundation layer mounted on a motherboard;
a heater embedded in the foundation layer to provide local heat to reflow solder to enable at least one of attachment or detachment of a package with respect to a socket, wherein the package includes a solderable extension beyond the socket, the package comprising a die mounted to a package substrate, wherein the heater comprises a metallic resistive layer; and
a connector mounted on the foundation layer and coupled to the heater and to the package to provide a connection path directly with a power supply, the connection path bypassing the motherboard to supply power to the die and the heater.

6. The interposer of claim 5, wherein the foundation layer frames a perimeter of a socket mounted on a motherboard.

7. The interposer of claim 5, wherein the foundation layer resides between the socket and the motherboard.

8. The interposer of claim 5, wherein the heater is embedded in the foundation layer and wherein the solderable extension resides above the heater.

9. The interposer of claim 5, wherein the heater is embedded beneath the solderable extension of the package.

10. The interposer of claim 5, further comprising a power component mounted on the foundation layer, wherein the power component provide voltage regulation.

11. The interposer of claim 5, wherein the foundation layer comprises a printed circuit board.

12. The interposer of claim 5, wherein the socket comprises a land grid array (LGA) socket and the package comprises an LGA package.

13. An interposer comprising:
a foundation layer mountable between a motherboard and a plurality of packages, each of the plurality of packages comprising a die mounted to a package substrate;
a plurality of heater zones embedded in the foundation layer to provide local heat to reflow solder to enable at least one of attachment or detachment of the plurality of packages respectively; and
a connector mounted on the foundation layer and coupled to the plurality of heater zones and to the plurality of packages to provide connection paths directly with a power supply, the connection paths bypassing the motherboard to supply power to the dies and the plurality of heater zones.

14. The interposer of claim 13, further comprising a power component mounted on the foundation layer and coupled to the connector, to the heater zones, and to the plurality of packages.

15. The interposer of claim 13, wherein the foundation layer comprises a printed circuit board.

16. The interposer of claim 13, wherein each of the plurality of packages comprises a ball grid array (BGA) package.

17. An interposer comprising:
a foundation layer with a plurality of zones of metallic pads for receiving a plurality of packages, wherein the foundation layer is mountable to a motherboard, each of the plurality of packages comprising a die mounted to a package substrate;
a plurality of heater zones embedded in the foundation layer to provide local heat to reflow solder to enable at least one of attachment or detachment of the plurality of packages respectively with respect to a topside of the foundation layer, wherein at least one heater zone selected from the plurality of heater zones comprises a metallic resistive layer; and
a connector mounted on the foundation layer and coupled to the plurality of heater zones and to the plurality of packages to provide connection paths directly with a power supply, the connection paths bypassing the motherboard to supply power to the dies and the plurality of heater zones.

18. The interposer of claim 17, further comprising a power component mounted on the foundation layer and coupled to the connector, to the plurality of heaters zones, and to the plurality of packages.

19. The interposer of claim 17, wherein the foundation layer comprises a printed circuit board.

20. The interposer of claim 17, wherein each of the plurality of packages comprises a ball grid array (BGA) package.

21. The interposer of claim 17, wherein each of the plurality of packages comprises a land grid array (LGA) package.

* * * * *